(12) United States Patent
Fujinaga et al.

(10) Patent No.: US 10,490,390 B2
(45) Date of Patent: Nov. 26, 2019

(54) SUBSTRATE PROCESSING DEVICE

(71) Applicant: ULVAC, INC., Kanagawa (JP)

(72) Inventors: Tetsushi Fujinaga, Chigasaki (JP);
Atsuhito Ihori, Chigasaki (JP);
Masahiro Matsumoto, Chigasaki (JP);
Noriaki Tani, Chigasaki (JP);
Harunori Iwai, Chigasaki (JP); Kenji
Iwata, Chigasaki (JP); Yoshinao Sato,
Chigasaki (JP)

(73) Assignee: ULVAC, INC., Kanagawa (JP)

( * ) Notice: Subject to any disclaimer, the term of this patent is extended or adjusted under 35 U.S.C. 154(b) by 0 days.

(21) Appl. No.: 15/542,861

(22) PCT Filed: Jun. 8, 2016

(86) PCT No.: PCT/JP2016/067108
§ 371 (c)(1),
(2) Date: Jul. 11, 2017

(87) PCT Pub. No.: WO2017/002564
PCT Pub. Date: Jan. 5, 2017

(65) Prior Publication Data
US 2018/0012734 A1 Jan. 11, 2018

(30) Foreign Application Priority Data
Jun. 29, 2015 (JP) .................. 2015-129700

(51) Int. Cl.
C23C 14/34 (2006.01)
H01J 37/32 (2006.01)
(Continued)

(52) U.S. Cl.
CPC ...... *H01J 37/32449* (2013.01); *C23C 14/022* (2013.01); *C23C 14/566* (2013.01);
(Continued)

(58) Field of Classification Search
CPC .................................. H01J 37/32091
See application file for complete search history.

(56) References Cited

U.S. PATENT DOCUMENTS

2008/0099039 A1* 5/2008 Krassnitzer ........... B08B 7/0035
134/1.1
2009/0000743 A1 1/2009 Iizuka
(Continued)

FOREIGN PATENT DOCUMENTS

JP H02134814 5/1990
JP 2009-010101 A 1/2009
(Continued)

Primary Examiner — Jason Berman
(74) Attorney, Agent, or Firm — Christensen, Fonder, Dardi & Herbert PLLC

(57) ABSTRACT

A substrate processing device includes a housing connected to ground, a cathode stage that supports a substrate, an anode unit, and a gas feeding unit that feeds gas toward the first plate. The cathode stage is applied with voltage for generating plasma. The anode unit includes a first plate including first through holes and a second plate including second through holes that are larger than the first through holes. The second plate is located between the first plate and the cathode stage. The first plate produces a flow of the gas through the first through holes. The gas that has passed through the first through holes flows through the second through holes into an area between the second plate and the cathode stage. A distance between the first plate and the second plate is 10 mm or greater and 50 mm or less.

8 Claims, 4 Drawing Sheets

(51) Int. Cl.
   *C23C 14/56*   (2006.01)
   *C23C 14/02*   (2006.01)
   *H01J 37/34*   (2006.01)
(52) U.S. Cl.
   CPC .... *H01J 37/3244* (2013.01); *H01J 37/32091* (2013.01); *H01J 37/3464* (2013.01); *H01J 2237/334* (2013.01); *H01J 2237/335* (2013.01)

(56) References Cited

U.S. PATENT DOCUMENTS

| 2011/0049102 A1* | 3/2011 | Kroll | H01J 37/32091 |
| --- | --- | --- | --- |
| | | | 216/71 |
| 2012/0031559 A1* | 2/2012 | Dhindsa | H01J 37/32091 |
| | | | 156/345.26 |
| 2012/0247673 A1 | 10/2012 | Hayashi et al. | |

FOREIGN PATENT DOCUMENTS

| JP | 2010031343 | 2/2010 |
| --- | --- | --- |
| JP | 2012-216823 A | 11/2012 |
| JP | 2014-148736 A | 8/2014 |
| KR | 10-2010-0078873 A | 7/2010 |

* cited by examiner

SUBSTRATE PROCESSING DEVICE

RELATED APPLICATIONS

The present application is a National Phase entry of PCT Application No. PCT/JP2016/067108, filed Jun. 8, 2016, which claims priority from Japanese Patent Application No. 2015-129700, filed Jun. 29, 2015, the disclosures of which are hereby incorporated by reference herein in their entirety.

TECHNICAL FIELD

The present invention relates to a substrate processing device that performs a sputtering process on the surface of a substrate.

BACKGROUND ART

Substrate processing devices that perform various types of processes on thin resin substrates are known in the art. A substrate processing device includes, for example, a cleaning unit that cleans the surface of a substrate and a film formation unit that forms a metal film on the surface of the cleaned substrate. For example, the cleaning unit sputters the surface of the substrate to remove foreign matter from the surface of the substrate. Further, the substrate processing device includes a transportation unit that transports the substrate between the cleaning unit and the film formation unit. The transportation unit holds the substrate upright and substantially extending in the vertical direction when transporting the substrate.

The cleaning unit includes a vacuum tank that is connected to ground. The substrate is supported by the transportation unit in contact with a stage inside the vacuum tank. In this state, high-frequency voltage is applied to the stage. As a result, the stage that includes the substrate functions as a cathode and the portion of the vacuum tank that opposes the cathode functions as an anode. Plasma is generated around the substrate from the gas supplied to the chamber. The positive ions in the plasma are sputtered against the surface of the substrate. This cleans the surface of the substrate (refer to, for example, patent document 1).

Patent Document

Patent Document 1: Japanese Laid-Open Patent Publication No. 2014-148736

SUMMARY OF THE INVENTION

When the substrate is sputtered, the transportation unit is in contact with a portion of the vacuum tank that is at the ground potential. Accordingly, the transportation unit that is at the ground potential is capacitively coupled the stage to which high-frequency voltage is applied. As a result, some of the high-frequency voltage is consumed without contributing to the generation of plasma. This hinders the increase of the plasma density per unit electric power and consequently hinders increases in the foreign matter removal speed.

Such a problem is not limited to the substrate processing device that supports a substrate with the transportation device. A substrate processing device including a support unit that supports a substrate in a substantially horizontal state also consumes some of the high-frequency voltage applied to the stage without the consumed high-frequency voltage contributing to the generation of plasma in the same manner as the substrate processing device that includes the transportation unit.

It is an object of the present invention to provide a substrate processing device that increases the sputtering efficiency per consumed power.

One aspect of a substrate processing device includes a housing connected to ground and a cathode stage located in the housing and configured to support a substrate. Voltage for generating plasma is applied to the cathode stage. An anode unit is fixed to the housing. The anode unit includes a first plate that is located in the housing and includes first through holes and a second plate that is located between the first plate and the cathode stage and includes second through holes that are larger than the first through holes. A gas feeding unit feeds gas toward the first plate. The first plate is configured to produce a flow of the gas through the first through holes so that the gas is dispersed in a planar direction of the first plate. The second plate is configured so that the gas that has passed through the first through holes flows through the second through holes into an area between the second plate and the cathode stage. The second through holes are shaped so that plasma inside each second through hole has a luminescence intensity that is higher than that of plasma generated between the second plate and the cathode stage.

With the substrate processing device, the application of voltage to the cathode stage when gas is fed via the first plate to the second plate generates plasma inside each second through hole of the second plate in addition to the plasma generated between the anode unit and the cathode stage. This increases the plasma density in the housing and increases the density of charged particles flying toward the substrate. As a result, the sputtering speed per consumed power is increased.

In one embodiment, the second plate is located at a position opposing the first plate. In this case, it is preferred that the substrate processing device further include an enclosure that entirely closes an open region between the first plate and the second plate in a circumferential direction of the first plate.

With this structure, the enclosure closes the open region between the first plate and the second plate. This easily increases the pressure inside each second through hole.

In one embodiment, it is preferred that the substrate processing device further includes a partition that entirely partitions an open region between the first plate and an inner wall of the housing in the anode unit from an outer side of the anode unit in a circumferential direction of the first plate.

With this structure, the partition partitions the open region between the first plate and the inner wall of the housing. Thus, the gas fed toward the first plate easily flows through the first through holes into the space between the first plate and the second plate. Consequently, the pressure inside the second through holes can easily be increased.

In one embodiment, the second through holes are each circular and have a diameter of 3 mm or greater and 20 mm or less.

With this structure, plasma having high density is easily generated inside the second through holes.

In one embodiment, the first through holes are each circular and have a diameter of 0.5 mm or greater and 5 mm or less.

This structure limits the plasma in the second through holes that enters the first through holes. This allows the plasma resistance required for the first plate to be reduced.

DESCRIPTION OF THE EMBODIMENTS

One embodiment of a substrate processing device will now be described with reference to FIGS. 1 to 9. The structure of the substrate processing device, the structure of the cleaning chamber of the substrate processing device, the operation of the cleaning chamber, and examples will sequentially be described hereafter.

[Structure of Substrate Processing Device]

The structure of the substrate processing device will now be described with reference to FIG. 1.

Figure 1:
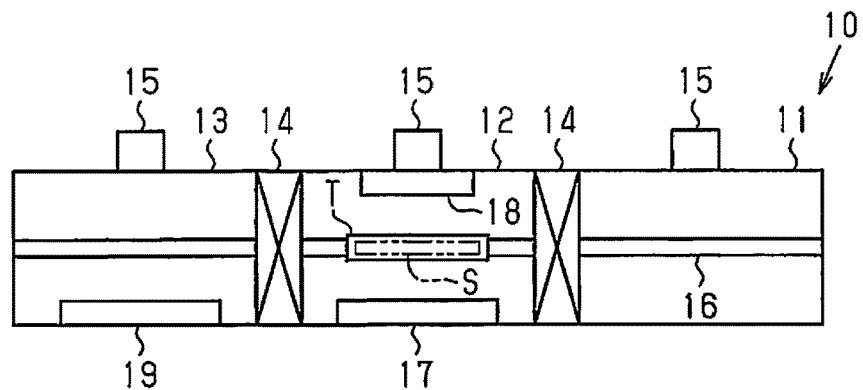
FIG. 1 is a schematic plan view showing a substrate processing device in one embodiment.

As shown in FIG. 1, a substrate processing device 10 includes a loading-unloading chamber 11, a cleaning chamber 12, and a sputtering chamber 13. The loading-unloading chamber 11, the cleaning chamber 12, and the sputtering chamber 13 are sequentially arranged next to one another in a coupling direction, which is one direction.

In the coupling direction, a gate valve 14 is located between the loading-unloading chamber 11 and the cleaning chamber 12 and between the cleaning chamber 12 and the sputtering chamber 13. Each gate valve 14 is connected to the two chambers located at opposite sides of the gate valve 14. When the gate valve 14 opens, the two chambers that are adjacent to each other in the coupling direction form a single internal region. When the gate valve 14 closes, each of the two chambers that are adjacent to each other in the coupling direction form an independent internal region.

Each chamber includes an exhaust unit 15. The exhaust unit 15 reduces the pressure of the internal region in the corresponding chamber. For example, the exhaust unit 15 creates a vacuum in the internal region of the corresponding chamber. The substrate processing device 10 includes a transportation unit 16 that extends from the loading-unloading chamber 11 to the sputtering chamber 13 in the coupling direction. The transportation unit 16 transports a tray T that supports a substrate S, which is the processed subject of the substrate processing device 10. The transportation unit 16 can fix the tray T at a predetermined position in the coupling direction.

The substrate S, which is to undergo processing and is supported by the tray T, is loaded into the loading-unloading chamber 11 from outside the substrate processing device 10. The substrate S is then unloaded from the loading-unloading chamber 11 and sent to the cleaning chamber 12. The processed substrate S, which is supported by the tray T, is loaded into the loading-unloading chamber 11 from the cleaning chamber 12 and then unloaded out of the loading-unloading chamber 11 to the outside of the substrate processing device 10.

The cleaning chamber 12 includes an anode unit 17, which is fixed to an inner surface of the substrate processing device 10, and a cathode stage 18, which is opposed to the anode unit 17. The cleaning chamber 12 cleans the substrate S that is to undergo processing in order to remove foreign matter from the surface of the substrate S.

The sputtering chamber 13 includes a cathode unit 19. The cathode unit 19 includes a target formed from a predetermined material. The sputtering chamber 13 sputters the target to form a predetermined film on the surface of the cleaned substrate S.

The substrate processing device 10 may include a chamber that performs a process other than the processes performed by the three chambers 11 to 13 or may include more than one sputtering chamber 13. Further, the substrate processing device 10 need only include at least one cleaning chamber 12 and need only include at least one of the sputtering chamber 13 and the loading-unloading chamber 11.

[Structure of Cleaning Chamber]

The structure of the cleaning chamber 12 will now be described with reference to FIGS. 2 to 7.

Figure 2:
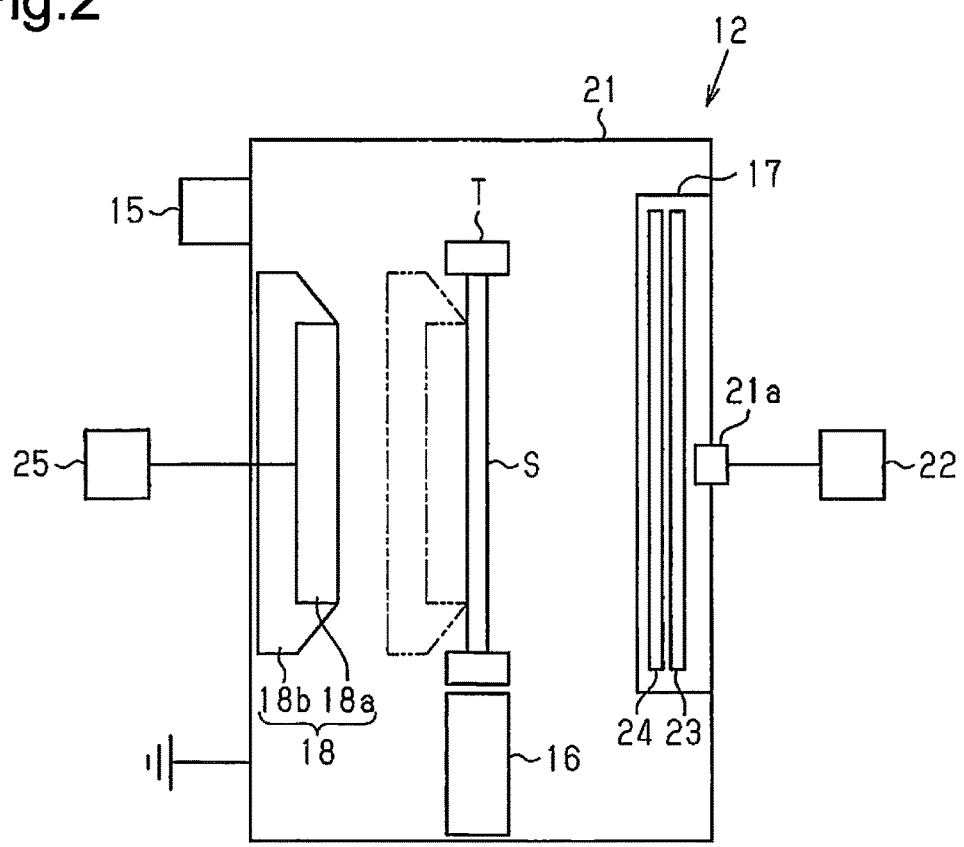
FIG. 2 is a schematic side view showing a cleaning chamber of the substrate processing device illustrated in FIG. 1.

As shown in FIG. 2, the cleaning chamber 12 includes a housing 21, which is connected to ground, and a gas feeding unit 22. The cathode stage 18 and the anode unit 17 are arranged in the housing 21. The cathode stage 18 is configured to support the substrate S. Voltage is applied to the cathode stage 18 to generate plasma.

The anode unit 17, which includes a first plate 23 and a second plate 24, is fixed to the housing 21. The first plate 23 includes first through holes 23a (refer to FIG. 4). The gas feeding unit 22 feeds gas toward the first plate 23. The gas flows through the first through holes 23a of the first plate 23. This disperses the gas in the planar direction of the first plate 23.

The second plate 24 is located between the first plate 23 and the cathode stage 18. Further, the second plate 24 includes second through holes 24a (refer to FIG. 5) that are larger than the first through holes 23a. The gas that has passed through the first through holes 23a flows through the second through holes 24a of the second plate 24 into the area between the second plate 24 and the cathode stage 18. Each second through hole 24a is shaped so that the luminescence intensity of the plasma in the second through hole 24a is greater than the luminescence intensity of the plasma generated between the second plate 24 and the cathode stage 18. The plasma generated between the second plate 24 and the cathode stage 18 refers to the plasma generated between the anode unit 17 and the cathode stage 18, that is, the plasma generated outside the anode unit 17 (i.e., outside the through holes 24a).

When voltage is applied to the cathode stage 18 in a state in which gas is being supplied to the second plate 24 via the first plate 23, the cleaning chamber 12 generates plasma between the anode unit 17 and the cathode stage 18. Further, plasma is generated inside the second through holes 24a of the second plate 24.

Consequently, the density of plasma is increased around the second plate 24 of the anode unit 17. Further, the density of particles that fly toward the substrate S is increased. This increases the speed at which foreign matter is removed from the substrate S.

The cathode stage 18 includes a conductive portion 18a and an insulative portion 18b. The conductive portion 18a includes a contact surface that contacts the substrate S. The insulative portion 18b covers the conductive portion 18a except for the contact surface. A power supply 25 is connected to the conductive portion 18a to apply voltage to the cathode stage 18. The power supply 25 is, for example, a high-frequency power supply but may be a different power supply, for example, a DC power supply.

The anode unit 17 and the cathode stage 18 are opposed to each other in an opposing direction. The transportation unit 16 is located between the anode unit 17 and the cathode stage 18 in the opposing direction.

The cathode stage 18 can be positioned at a first position and a second position. The first position is where the contact surface of the conductive portion 18a in the cathode stage 18 contacts the substrate S (shown by double-dashed line in FIG. 2). The second position is where the cathode stage 18 does not contact (interfere with) the transportation unit 16 or the tray T, which is supported by the transportation unit 16.

The housing 21 includes a feed port 21a. The gas feeding unit 22 is connected to the feed port 21a. The gas feeding unit 22 feeds gas into the anode unit 17 through the feed port 21a. The gas feeding unit 22 is, for example, a mass flow controller connected to a gas tank located outside the substrate processing device 10. The gas feeding unit 22 feeds, for example, rare gas such as argon gas to generate plasma inside the housing 21.

The structure of the anode unit 17 will now be described in further detail with reference to FIGS. 3 to 7.

Figure 3:
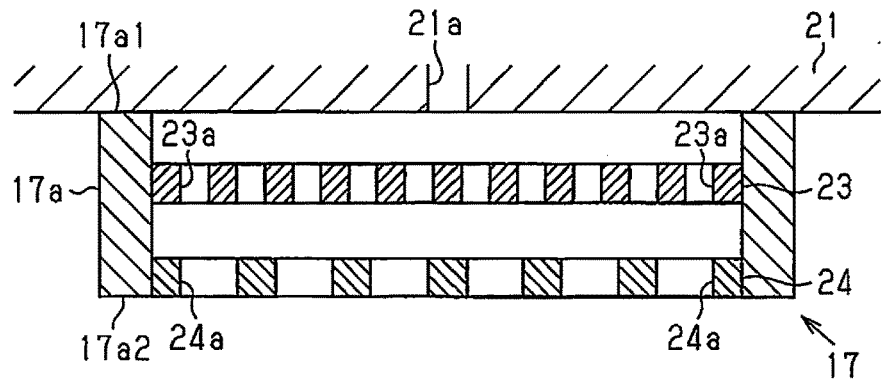
FIG. 3 is an enlarged cross-sectional view showing an anode unit of the cleaning chamber illustrated in FIG. 2.

As shown in FIG. 3, the anode unit 17 includes the first plate 23 and the second plate 24, which are arranged in the opposing direction. The feed port 21a of the housing 21, the first plate 23, and the second plate 24 are arranged in this order in the opposing direction. The first plate 23 is located between the feed port 21a and the second plate 24. The distance between the first plate 23 and the second plate 24 in the opposing direction is preferably, for example, 10 mm or greater and 50 mm or less.

Each first through hole 23a of the first plate 23 extends through the first plate 23 in the opposing direction. Each second through hole 24a of the second plate 24 extends through the second plate 24 in the opposing direction.

When the gas feeding unit 22 feeds gas from the feed port 21a to the anode unit 17, the gas flows through the first through holes 23a of the first plate 23. The gas dispersed in the planar direction of the first plate 23 flows toward the second plate 24. The gas that has passed through the first through holes 23a flows through the second through holes 24a of the second plate 24 to the area between the second plate 24 and the cathode stage 18.

The second through holes 24a of the second plate 24 are shaped so that the plasma generated at the surface of the second plate 24 opposing the cathode stage 18 enters each second through hole 24a.

The plasma generated outside the anode unit 17 enters the second through holes 24a. Thus, the plasma in the second through holes 24a contacts the gas flowing through the second through holes 24a. This generates new plasma inside the second plate 24.

In a plan view taken from the opposing direction of the second plate 24, each second through hole 24a is overlapped with one of the first through holes 23a.

The anode unit 17 facilitates the supply of gas to each second through hole 24a. Thus, plasma can be generated in all or most of the second through holes 24a.

The anode unit 17 includes a tubular support 17a that extends in the opposing direction. The support 17a, which is one example of an enclosure and a partition, includes a first tube end 17a1 and a second tube end 17a2. The first tube end 17a1 is fixed to the housing 21. The support 17a supports the first plate 23 and the second plate 24. The second plate 24 closes the opening at the second tube end 17a2 of the support 17a.

The first plate 23 is located in an internal region of the anode unit 17 surrounded by the support 17a, the second plate 24, and the inner wall of the housing 21. The support 17a entirely closes an open region between the first plate 23 and the second plate 24 in the circumferential direction of the first plate 23. The support 17a also entirely closes an open region between the first plate 23 and the inner wall of the housing 21 inside the anode unit 17 (inner wall where feed port 21a is located) in the circumferential direction of the first plate 23.

In this manner, the support 17a functions as an enclosure that closes the open region between the first plate 23 and the second plate 24. This allows the pressure inside the second through holes 24a to be easily increased. Further, the support 17a functions as a partition that partitions the open region between the first plate 23 and the housing 21 in the anode unit 17 from the outside of the anode unit 17. Thus, the gas sent toward the first plate 23 easily flows through the first through holes 23a into the open region between the first plate 23 and the second plate 24. Consequently, the pressure inside the second through holes 24a can easily be increased.

In the anode unit 17, the first plate 23, the second plate 24, and the support 17a are formed from metal. Further, the first tube end 17a1 of the support 17a of the anode unit 17 is fixed to the housing 21. Thus, the anode unit 17 is also at the ground potential.

Figure 4:
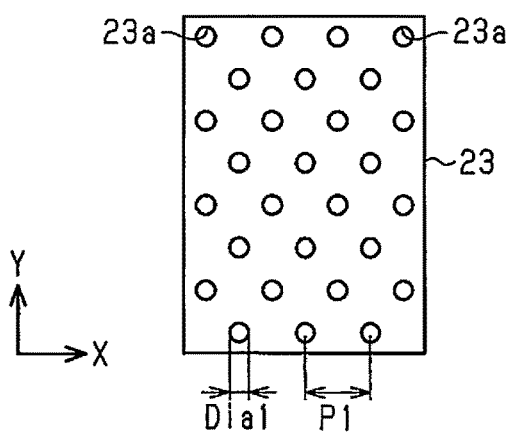
FIG. 4 is an enlarged plan view showing in part a first plate of the anode unit illustrated in FIG. 3.

As shown in FIG. 4, in a plan view of the first plate 23 taken from the opposing direction, the first through holes 23a are regularly arranged in the plane of the first plate 23. However, the first through holes 23a may be irregularly arranged in the plane of the first plate 23 in a plan view.

For example, the first through holes 23a are regularly arranged in the plane of the first plate 23 in the X-direction and the Y-direction, which is orthogonal to the Y-direction. The first through holes 23a are arranged at a predetermined first pitch P1 in the X-direction and the Y-direction. Preferably, the first pitch P1 is, for example, 1.5 mm or greater and 15 mm or less.

Each first through hole 23a is circular and has a diameter that is a first diameter Dia1. Preferably, the first diameter Dia1 is, for example, 0.5 mm or greater and 5 mm or less.

As long as the first diameter Dia1 is 0.5 mm or greater and 5 mm or less, the plasma P from the second through holes 24a that enters the first through holes 23a is limited. This allows the plasma resistance of the first plate 23 to be reduced.

In the plane of the first plate 23, the percentage of the total area of the first through holes 23a relative to the area of the first plate 23 is referred to as the first opening rate (%). Preferably, the first opening rate is 5% or greater and 50% or less.

Figure 5:
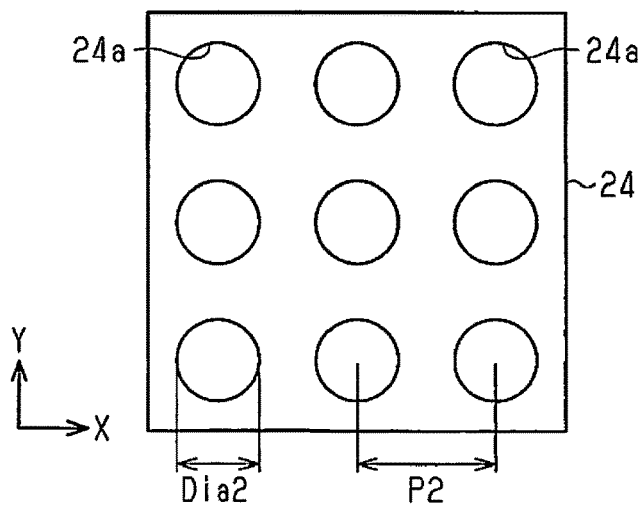
FIG. 5 is an enlarged plan view showing in part a second plate of the anode unit illustrated in FIG. 3.

As shown in FIG. 5, in a plan view of the second plate 24 taken from the opposing direction, the second through holes 24a are regularly arranged in the plane of the second plate 24. However, the second through holes 24a may be irregularly arranged in the plane of the second plate 24 in a plan view.

For example, the second through holes 24a are regularly arranged in the plane of the second plate 24 in the X-direction and the Y-direction. The second through holes 24a are arranged at a predetermined second pitch P2 in the X-direction and the Y-direction. Preferably, the second pitch P2 is, for example, 9 mm or greater and 60 mm or less.

Each second through holes 24a is circular and has a diameter that is a second diameter Dia2. The second diameter Dia2 is greater than the first diameter Dia1 and preferably, for example, 3 mm or greater and 20 mm or less.

As long as the second diameter Dia2 is 3 mm or greater and 20 mm or less, the ionization efficiency is increased inside each second through hole 24a. This allows the plasma P generated around the second plate 24 (around each second through hole 24a) to have a high density.

In the plane of the second plate 24, the percentage of the total area of the second through holes 24a relative to the area of the second plate 24 is referred to as the second opening rate (%). Preferably, the second opening rate is 20% or greater and 99% or less.

Figure 6:
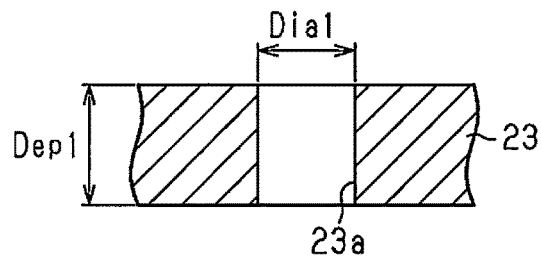
FIG. 6 is a partially, enlarged cross-sectional view of the first plate illustrated in FIG. 4.

Referring to FIG. 6, each first through hole 23a has a length in the opposing direction that defines a first depth Dep1. In the first through hole 23a, the ratio of the first diameter Dia1 to the first depth Dep1 is defined as a first aspect ratio AR1. Preferably, the first aspect ratio AR1 is, for example, 0.1 or greater and 5 or less.

Figure 7:
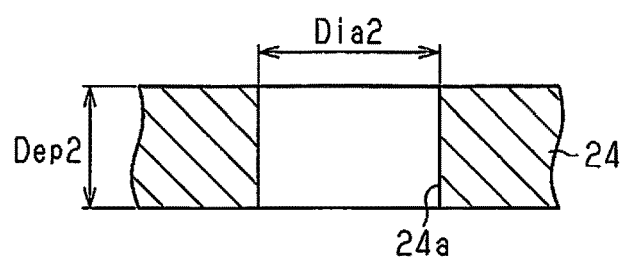
FIG. 7 is a partially, enlarged cross-sectional view of the second plate illustrated in FIG. 5.

Referring to FIG. 7, each second through hole 24a has a length in the opposing direction that defines a second depth Dep2. In the second through hole 24a, the ratio of the second diameter Dia2 to the second depth Dep2 is defined as a second aspect ratio AR2. Preferably, the second aspect ratio AR2 is, for example, 0.5 or greater and 15 or less.

[Operation of Cleaning Chamber]

The operation of the cleaning chamber 12 will now be described with reference to FIGS. 8 and 9.

Figure 8:
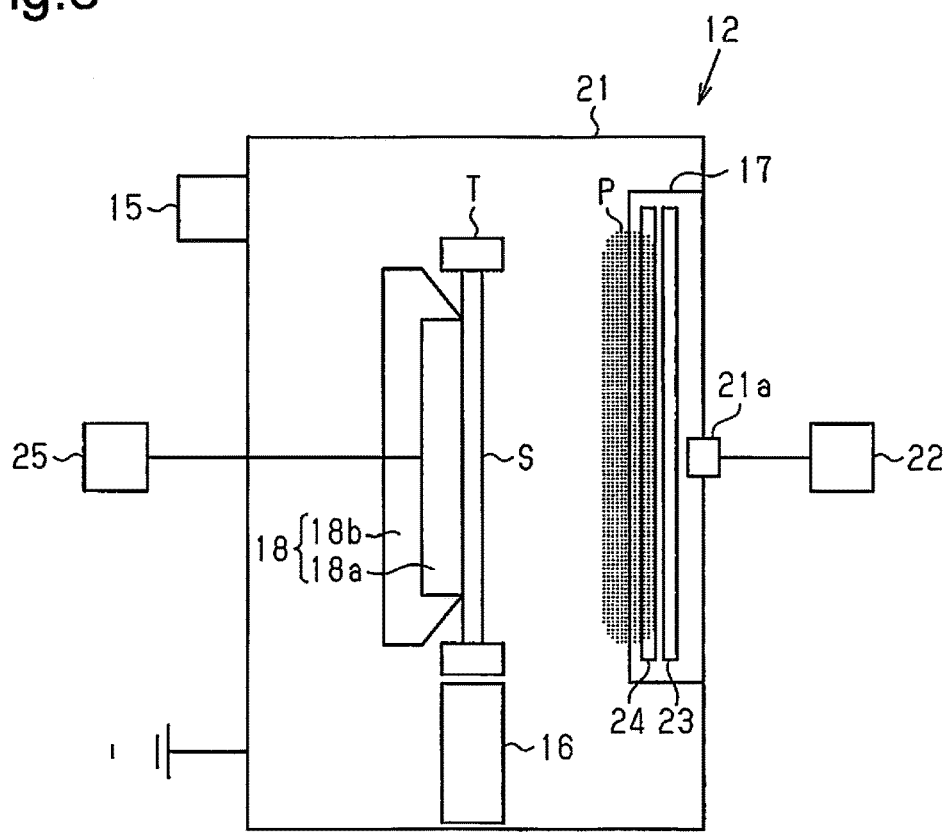
FIG. 8 is a side view of the cleaning chamber illustrating the operation of the substrate processing device.

As shown in FIG. 8, when cleaning the substrate S in the cleaning chamber 12, the transportation unit 16 first transports the tray T, which has been loaded from the loading-unloading chamber 11 into the cleaning chamber 12, to a processing position opposing the anode unit 17 and fixes the tray T at the processing position. When the tray T is unloaded into the cleaning chamber 12, the pressure inside the housing 21 is reduced by the exhaust unit 15 to a predetermined pressure.

The cathode stage 18 is next moved from the second position to the first position (position of FIG. 8), and the contact surface of the conductive portion 18a comes into contact with the surface of the substrate S. The gas feeding unit 22 feeds argon gas so that the pressure inside the housing 21 becomes equal to a predetermined pressure. The gas feeding unit 22 may start to feed argon gas before the cathode stage 18 moves or at substantially the same time as when the cathode stage 18 moves.

Then, the power supply 25 applies voltage to the cathode stage 18 to generate the plasma P inside the housing 21. The positive ions in the plasma P fly toward the substrate S and strike the surface of the substrate S that is opposed to the anode unit 17. This removes foreign matter from the surface of the substrate S that is opposed to the anode unit 17.

Here, the pressure inside the housing 21 is preferably, for example, 0.1 Pa or greater and 30 Pa or less. The power supplied to the cathode stage 18 is preferably 0.04 W/cm$^2$ or greater and 4 W/cm$^2$ or less. Further, the frequency of the power supplied by the power supply 25 is preferably 1 MHz or greater and 40 MHz or less. Further, power having a frequency of 100 Hz or greater and 2 MHz or less may be superimposed on the power having the frequency of 1 MHz or greater and 40 MHz or less. In this case, it is preferred that power having a frequency of 100 Hz or greater and 2 MHz or less be 0.02 W/cm$^2$ or greater and 0.8 W/cm$^2$ or less.

Figure 9:
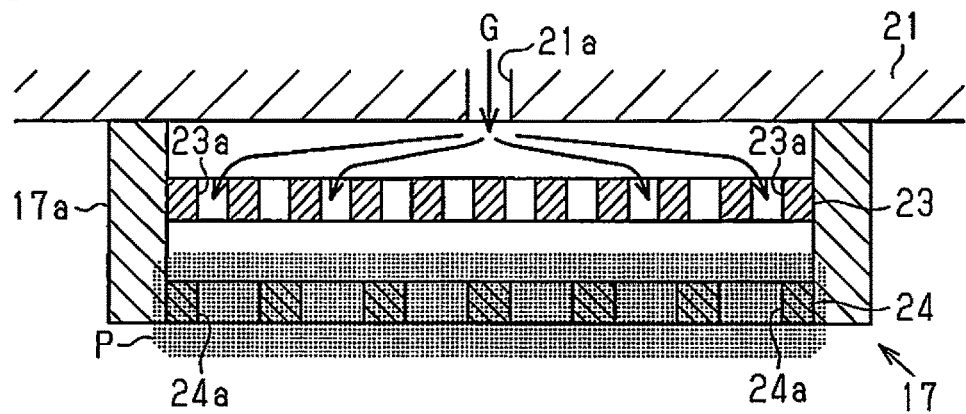
FIG. 9 is a cross-sectional view of the anode unit illustrating the operation of the substrate processing device.

As shown in FIG. 9, when argon gas G is fed into the anode unit 17 from the feed port 21a, the argon gas G passes through the first through holes 23a. This disperses the argon gas G in the planar direction of the first plate 23.

The pressure inside each second through hole 24a is higher than the pressure outside the anode unit 17. Thus, the plasma P generated outside the anode unit 17 (between anode unit 17 and cathode stage 18) that enters the second through holes 24a easily contacts the gas flowing through the second through holes 24a. Consequently, new plasma is also generated inside the second through holes 24a.

Plasma is also generated at a location separated from the second plate 24 between the anode unit 17 and the cathode stage 18 inside the housing 21. In this case, the new plasma generated inside each through hole 24a results in the luminescence intensity of the plasma formed around the second plate 24, which includes the second through holes 24a, being greater than the luminescence intensity of the plasma generated between the second plate 24 and the cathode stage 18.

In this regard, plasma will also be generated in the housing 21 when replacing the anode unit 17 with a portion of the housing 21 that functions as an anode or a metal plate located at a position opposing the cathode stage 18 that functions as an anode. However, in comparison with the substrate processing device 10 that includes the anode unit 17, there will be no portion in the housing 21 where the pressure of gas is increased to generate plasma. Thus, there is no portion where the plasma luminescence intensity is increased.

In this manner, the luminescence intensity of the plasma formed around the second plate 24, which includes the through holes 24a, is greater than the luminescence intensity of the plasma generated between the second plate 24 and the cathode stage 18 in the anode unit 17. Thus, the plasma density inside the housing 21 is increased even when some of the high-frequency voltage is consumed by the capacitive coupling of the transportation unit 16 and the cathode stage 18. As a result, the sputtering efficiency per consumed power can be increased.

EXAMPLE AND COMPARATIVE EXAMPLE

An example and various comparative examples will now be described. Same reference characters are given to those components that are the same as the corresponding components of the above embodiment.

Example 1

The substrate S was prepared with a SiO$_2$ film formed on a processing surface subject to the cleaning process. The cleaning chamber 12 was used to clean the processing surface. The cleaning process was performed under the conditions described below. Argon gas was used to generate plasma in the housing 21.

Pressure inside housing 1.0 Pa

Electric power 0.6 W/cm$^2$ (13.56 MHz)

The anode unit 17 was provided with the first plate 23 including the first through holes 23a, which had the first diameter Dia1 of 2 mm, and the second plate 24 including the second through holes 24a, which had the second diameter Dia2 of 9 mm. Argon gas was fed from the feed port 21a of the housing toward the first plate 23 of the anode unit 17.

Comparative Example 1

A cleaning process was performed on the substrate S under the same conditions as example 1 except in that the cleaning process was performed on the substrate S using a metal plate located at a position opposing the cathode stage 18 instead of the anode unit 17 of example 1.

Comparative Example 2

A cleaning process was performed on the substrate S under the same conditions as example 1 except in that each second through hole 24a of the second plate 24 in the anode unit 17 of example 1 had the second diameter Dia2 of 2 mm.

Comparative Example 3

A cleaning process was performed on the substrate S under the same conditions as example 1 except in that argon gas was fed into the housing 21 at a location outside the anode unit 17.

[Substrate Etching Speed]

The speed for etching the $SiO_2$ film was calculated as the speed for removing foreign matter from the surface of the substrate S for each of example 1 and comparative examples 1 to 3. The thickness of the $SiO_2$ film prior to etching and the thickness of the $SiO_2$ film subsequent to etching were measured. Then, the value obtained by subtracting the thickness of the $SiO_2$ film prior to etching from the thickness of the $SiO_2$ film subsequent to etching was divided by the processing time to calculate the etching speed. The calculation result of the etching speed is shown below in table 1.

TABLE 1

|  | Diameter (mm) | Supplied Portion | Speed (mm/min) |
| --- | --- | --- | --- |
| Example 1 | 9 | Anode Unit | 5.8 |
| Com. Example 1 | — | Housing | 3.2 |
| Com. Example 2 | 2 | Anode Unit | 2.6 |
| Com. Example 3 | 9 | Housing | 3.0 |

As shown in table 1, the etching speed in example 1 was 5.8 mm/min. In contrast, the etching speed in comparative example 1 was 3.2 mm/min, the etching speed in comparative example 2 was 2.6 mm/min, and the etching speed in comparative example 3 was 3.0 mm/min.

In this manner, it is understood that the etching speed of the substrate S, that is, the removing speed of foreign matter from the surface of the substrate S, was increased by using the anode unit 17 in which the second diameter Dia2 of the second plate 24 was larger than the first diameter Dia1 of the first plate 23 and by feeding gas for generating plasma to the first plate 23.

The embodiment of the substrate processing device 10 has the advantages described below.

(1) When voltage is applied to the cathode stage 18 in a state in which gas is fed via the first plate 23 to the second plate 24, in addition to the plasma P generated between the anode unit 17 and the cathode stage 18, the plasma P can be generated inside each second through hole 24a of the second plate 24. This increases the density of the plasma P inside the housing 21 and the density of the charged particles attracted toward the substrate S. As a result, the speed for removing foreign matter from the substrate S is increased.

(2) The support 17a closes the open region between the first plate 23 and the second plate 24. This increases the pressure inside the second through holes 24a and accelerates the generation of plasma inside the second through holes 24a.

(3) The support 17a partitions the open region between the first plate 23 and the inner wall of the housing 21 in the anode unit 17 from the outside of the anode unit 17. Thus, the gas fed toward the first plate 23 easily flows to the open region between the first plate 23 and the second plate 24 through the first through holes 23a. This easily increases the pressure inside the second through holes 24a.

(4) The second diameter Dia2 is 3 mm or greater and 20 mm or less. This increases the ionization efficiency of the gas inside the second through holes 24a and generates the plasma P with high density around the second plate 24.

(5) The first diameter Dia1 is 0.5 mm or greater and 5 mm or less. This reduces the plasma P from the second through holes 24a that enters the first through holes 23a. Thus, the plasma resistance required for the first plate 23 can be reduced.

The embodiment described above may be modified and practiced as described below.

The first through holes 23a and the second through holes 24a do not have to be circular and may have other shapes.

Figure 10:
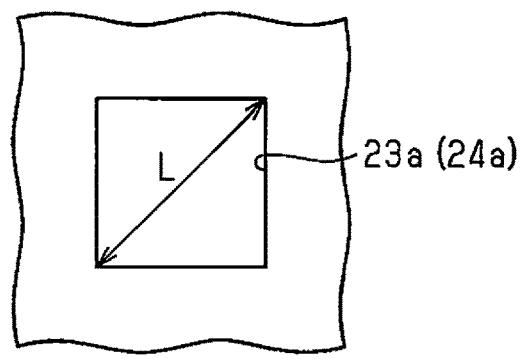
FIG. 10 is a plan view showing the shape of a through hole in each plate of a modified example.

For example, as shown in FIG. 10, the plates 23 and 24 may respectively include through holes 23a and 24a having square shapes in a plan view. In such a structure, each of the through holes 23a and 24a has a flow path width L, which is the maximum length, or diagonal length, of the through holes 23a and 24a in a plan view of the plates 23 and 24 that need only have a dimension in a range including the first diameter Dia1 in the case of the first through holes 23a and need only have a dimension in a range including the second diameter Dia2 in the case of the second through holes 24a. This obtains advantages (4) and (5).

In a plan view of the plates 23 and 24, the through holes 23a and 24a may have any quadrate shape in addition to a square or may have any polygonal shape in addition to a quadrate shape, for example, a pentagonal shaped or a hexagonal shape.

Figure 11:
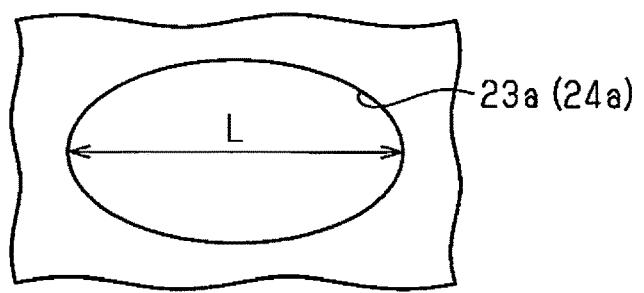
FIG. 11 is a plan view illustrating the shape of a through hole in each plate of another modified example.

Further, as shown in FIG. 11, the through holes 23a and 24a may each have an elliptical shape in a plan view of the plates 23 and 24. In such a structure, the flow path width L of the through holes 23a and 24a need only have a dimension in a range including the first diameter Dia1 in the case of the first through holes 23a and need only have a dimension including the second diameter Dia2 in the case of the second through holes 24a. This obtains advantages (4) and (5) that are described above.

The first through holes 23a may have different first diameters Dia1 as long as the dimension of the first diameter Dia1 of each first through hole 23a is included in the range described above and smaller than the second diameter Dia2 of the second through holes 24a.

The second through holes 24a may have different second diameters Dia2 as long as the dimension of the second diameter Dia2 of each second through hole 24a is included in the range described above.

The first diameter Dia1 of each first through hole 23a may be smaller than 0.5 mm or larger than 5 mm as long as gas can be dispersed in the planar direction of the first plate 23 and the first diameter Dia1 is smaller than the second diameter Dia2 of each second through hole 24a.

The second diameter Dia2 of each second through hole 24a may be smaller than 3 mm or larger than 20 mm as long as the luminescence intensity of the plasma inside the second through holes 24a is higher than the luminescence intensity of the plasma generated between the second plate 24 and the cathode stage 18 and the second diameter Dia2 is larger than the first diameter Dia1 of each first through hole 23a.

In a plan view of the second plate 24, there may be at least some second through holes 24a that are not overlapped with any of the first through holes 23a.

The second through holes 24a do not have to be shaped in a manner resulting from the plasma formed between the second plate 24 and the cathode stage 18 entering the second through holes 24a. Such a structure also obtains advantage (1) as long as the second through holes 24a are shaped so that the luminescence intensity of the plasma inside the second through holes 24a is higher than the luminescence intensity of the plasma generated between the second plate 24 and the cathode stage 18.

In the above embodiment, the enclosure and the partition are formed by the same member (support 17a). However, the enclosure and the partition may be formed by different members.

For example, the support 17a may be formed by two members.

The open region between the first plate 23 and the second plate 24 may be open and not closed by the enclosure (support 17a). In such a structure, as long as the gas fed through the first through holes 23a of the first plate 23 does not flow through the second through holes 24a of the second plate 24 toward the cathode stage 18, the pressure inside the second through holes 24a can be increased to be higher than the pressure between the second plate 24 and the cathode stage 18. This allows the sputtering efficiency per consumed power to be increased.

The open region between the first plate 23 and the inner wall of the housing 21 in the anode unit 17 may be open and not partitioned by the partition (support 17a). In such a structure, as long as the gas fed through the first through holes 23a of the first plate 23 flows through the second through holes 24a of the second plate 24 and toward the cathode stage 18, the pressure inside the second through holes 24a can be higher than the pressure between the second plate 24 and the cathode stage 18. This increases the sputtering efficiency per consumed power.

The cathode stage 18 may be fixed at a predetermined position in the housing 21 as long as it does not interfere with the transportation of the tray T.

The cathode stage 18 may be fixed at a location inside the housing 21 and the transportation unit 16 may be moved in the opposing direction in which the anode unit 17 and the cathode stage 18 are opposed to each other to move the tray T between the first position and the second position. In this case, the first position and the second position are located at different positions in the opposing direction. The first position is where the transportation unit 16 can transport the tray T without interference between the tray T and the cathode stage 18, and the second position is where the cathode stage 18 and the substrate S contact each other.

The cathode stage 18 is formed so that the part of the conductive portion 18a that comes into contact with the substrate S is exposed from the insulative portion 18b. However, as long as voltage can be applied to the substrate S, the conductive portion 18a may be entirely covered by the insulative portion 18b.

The substrate processing device 10 may perform the cleaning process on the substrate S with the tray T arranged in the horizontal direction. For example, as long as the substrate processing device 10 includes the chambers 11 to 13, the transportation unit 16 may transport the tray T arranged in a substantially horizontal direction in the chambers 11 to 13. Alternatively, when the substrate processing device 10 includes only the loading-unloading chamber 11 and the cleaning chamber 12, the loading-unloading chamber 11 may include a transportation robot that receives the tray T from outside the loading-unloading chamber 11 and transports the tray T to the cleaning chamber 12.

The tray T can be eliminated as long as the substrate S can be transported and processed without being supported by the tray T.

The invention claimed is:

1. A substrate processing device comprising:
a housing connected to ground;
a cathode stage located in the housing and configured to support a substrate, wherein voltage for generating plasma is applied to the cathode stage;
an anode unit fixed to the housing, wherein the anode unit includes
a first plate that is located in the housing and includes first through holes, and
a second plate that is located between the first plate and the cathode stage and includes second through holes that are larger than the first through holes; and
a gas feeding unit that feeds gas toward the first plate;
wherein the first plate is configured to produce a flow of the gas through the first through holes so that the gas is dispersed in a planar direction of the first plate,
the second plate is configured so that the gas that has passed through the first through holes flows through the second through holes into an area between the second plate and the cathode stage,
a distance between the first plate and the second plate is 10 mm or greater and 50 mm or less, and
the first plate and the second plate are each set at a ground potential.

2. The substrate processing device according to claim 1, wherein the second plate is located at a position opposing the first plate, and the substrate processing device further comprises an enclosure that entirely closes an open region between the first plate and the second plate in a circumferential direction of the first plate, wherein the second plate and the enclosure are metal and fixed to the housing to be set at the ground potential.

3. The substrate processing device according to claim 1, further comprising a partition that entirely partitions an open region between the first plate and an inner wall of the housing in the anode unit from an outer side of the anode unit in a circumferential direction of the first plate, wherein the first plate and the enclosure are metal and fixed to the housing to be set at the ground potential.

4. The substrate processing device according to claim 1, wherein the second through holes are each circular and have a diameter of 3 mm or greater and 20 mm or less.

5. The substrate processing device according to claim 4, wherein the first through holes are each circular and have a diameter of 0.5 mm or greater and 5 mm or less.

6. A substrate processing method using the substrate processing device of claim 1, the method comprising:
generating plasma inside the second through holes; and
generating plasma between the second plate and the cathode stage, wherein the plasma inside each second through hole has a luminescence intensity that is higher than that of the plasma generated between the second plate and the cathode stage.

7. The substrate processing method according to claim 6, wherein
a pressure inside the housing is 0.1 Pa or greater and 30 Pa or less,
a power supplied to the cathode stage is 0.04 W/cm$^2$ or greater and 4 W/cm$^2$ or less, and
a frequency of the power is 1 MHz or greater and 40 MHz or less.

8. The substrate processing method according to claim 7, further comprising
superimposing a power having a frequency of 100 Hz or greater and 2 MHz or less on the power having the frequency of 1 MHz or greater and 40 MHz or less, wherein the power of the frequency of 100 Hz or greater and 2 MHz or less is 0.02 W/cm$^2$ or greater and 0.8 W/cm$^2$ or less.

\* \* \* \* \*